United States Patent
Fogel et al.

(10) Patent No.: US 9,634,164 B2
(45) Date of Patent: *Apr. 25, 2017

(54) REDUCED LIGHT DEGRADATION DUE TO LOW POWER DEPOSITION OF BUFFER LAYER

(71) Applicant: INTERNATIONAL BUSINESS MACHINES CORPORATION, Armonk, NY (US)

(72) Inventors: Keith E. Fogel, Hopewell Junction, NY (US); Augustin J. Hong, Culver City, CA (US); Jeehwan Kim, Cambridge, MA (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/949,230

(22) Filed: Nov. 23, 2015

(65) Prior Publication Data

US 2016/0079456 A1 Mar. 17, 2016

Related U.S. Application Data

(63) Continuation of application No. 13/407,006, filed on Feb. 28, 2012, now Pat. No. 9,214,577.

(51) Int. Cl.
*H01L 31/0376* (2006.01)
*H01L 31/18* (2006.01)
*H01L 31/0224* (2006.01)
*H01L 31/075* (2012.01)

(52) U.S. Cl.
CPC .......... *H01L 31/03767* (2013.01); *H01L 31/022466* (2013.01); *H01L 31/075* (2013.01); *H01L 31/1804* (2013.01); *Y02E 10/547* (2013.01); *Y02E 10/548* (2013.01); *Y02P 70/521* (2015.11)

(58) Field of Classification Search
CPC ............ H01L 31/0224; H01L 31/0232; H01L 31/075; H01L 31/18
See application file for complete search history.

(56) References Cited

U.S. PATENT DOCUMENTS

| 4,357,179 A | 11/1982 | Adams et al. |
| 4,396,793 A | 8/1983 | Madan |
| 5,279,681 A | 1/1994 | Matsuda et al. |

(Continued)

FOREIGN PATENT DOCUMENTS

KR  657679  5/2010

OTHER PUBLICATIONS

Bouizem, Y. et al., "Optoelectronic properties of hydrogenated amorphous geranium deposited by rf-PECVD as a function of applied rf-power" Journal of Physics.: Condens. Matter, vol. 17, Aug. 2005. (pp. 5149-5158).

(Continued)

*Primary Examiner* — Mamadou Diallo
(74) *Attorney, Agent, or Firm* — Tutunjian & Bitetto, P.C.; Louis J. Percello

(57) ABSTRACT

Methods for forming a photovoltaic device include forming a buffer layer between a transparent electrode and a p-type layer. The buffer layer includes a work function that falls substantially in a middle of a barrier formed between the transparent electrode and the p-type layer to provide a greater resistance to light induced degradation. An intrinsic layer and an n-type layer are formed over the p-type layer.

20 Claims, 4 Drawing Sheets

(56) References Cited

U.S. PATENT DOCUMENTS

| | | |
|---|---|---|
| 5,282,993 A | 2/1994 | Karg |
| 6,037,614 A | 3/2000 | He et al. |
| 6,153,271 A | 11/2000 | Mearini |
| 6,180,870 B1 | 1/2001 | Sano et al. |
| 6,242,686 B1 | 6/2001 | Kishimoto et al. |
| 6,300,558 B1 | 10/2001 | Takamoto et al. |
| 6,399,873 B1 | 6/2002 | Sano et al. |
| 6,537,370 B1 | 3/2003 | Hernandez et al. |
| 6,835,888 B2 | 12/2004 | Sano et al. |
| 7,064,263 B2 | 6/2006 | Sano et al. |
| 7,122,736 B2 | 10/2006 | Wang et al. |
| 7,176,111 B2 | 2/2007 | Baert et al. |
| 7,238,545 B2 | 7/2007 | Yoshimi et al. |
| 7,276,749 B2 | 10/2007 | Martin et al. |
| 7,301,215 B2 | 11/2007 | Kariya |
| 7,906,826 B2 | 3/2011 | Martin et al. |
| 8,119,904 B2 | 2/2012 | Guha et al. |
| 8,394,670 B2 | 3/2013 | Herner |
| 2002/0125475 A1 | 9/2002 | Chu et al. |
| 2003/0079771 A1 | 5/2003 | Sano et al. |
| 2003/0124761 A1 | 7/2003 | Baert et al. |
| 2004/0231590 A1 | 11/2004 | Ovshinsky |
| 2007/0137695 A1 | 6/2007 | Fetzer et al. |
| 2007/0231488 A1 | 10/2007 | Von Kaenel |
| 2007/0235074 A1 | 10/2007 | Henley et al. |
| 2007/0248768 A1 | 10/2007 | Loboda et al. |
| 2007/0272297 A1 | 11/2007 | Krivoshlykov et al. |
| 2008/0105299 A1 | 5/2008 | Krasnov |
| 2008/0188033 A1 | 8/2008 | Choi et al. |
| 2009/0133753 A1 | 5/2009 | Sasaki et al. |
| 2009/0272423 A1 | 11/2009 | Niira et al. |
| 2010/0163100 A1 | 7/2010 | Goya et al. |
| 2010/0173127 A1 | 7/2010 | Lieten et al. |
| 2010/0307574 A1 | 12/2010 | Matsumoto et al. |
| 2011/0088760 A1 | 4/2011 | Sheng et al. |
| 2011/0126893 A1 | 6/2011 | Myong |
| 2011/0232754 A1 | 9/2011 | Myong |
| 2011/0272010 A1 | 11/2011 | Abou-Kandil et al. |
| 2011/0308583 A1 | 12/2011 | Joshi et al. |
| 2011/0315992 A1 | 12/2011 | Nguyen et al. |
| 2012/0012167 A1 | 1/2012 | Abou-Kandil et al. |
| 2012/0031476 A1 | 2/2012 | Bedell et al. |
| 2012/0031477 A1 | 2/2012 | Fogel et al. |
| 2012/0055534 A1 | 3/2012 | Leschkies et al. |
| 2012/0111395 A1 | 5/2012 | Kim |
| 2012/0152352 A1 | 6/2012 | Chen et al. |
| 2012/0318339 A1 | 12/2012 | Abou-Kandil et al. |
| 2013/0061915 A1 | 3/2013 | Myong et al. |
| 2013/0065349 A1 | 3/2013 | Assefa et al. |
| 2013/0221373 A1 | 8/2013 | Chen et al. |
| 2013/0221464 A1 | 8/2013 | Fogel et al. |
| 2013/0224899 A1 | 8/2013 | Abou-Kandil et al. |
| 2013/0298971 A1 | 11/2013 | Chen et al. |
| 2014/0106150 A1 | 4/2014 | Decker et al. |
| 2014/0120655 A1 | 5/2014 | Abou-Kandil et al. |
| 2015/0136210 A1 | 5/2015 | Multone et al. |

OTHER PUBLICATIONS

Hazra, S., et al., "Role of deposition parameters on the photovoltaic quality of amorphous silicon germanium alloys: correlation of microstructure with defect density and electronic transport." Journal of Physics D: App.

Landweer, G. "Photoemission Measurements on Aluminium and Amorphous Silicon by Pulsed Laser Illumination in Presence of a Plasma," Laboratoire de Physique des Interfaces et des Couches Minces, Aug. 12, 1996. (pp. 579-583).

Yang, Li. "Tricolor Microcavity OLEDs Based on P-nc-Si:H Films as the Complex Anodes," Journal of Semiconductors, Jun. 2009. vol. 30, No. 6. (6 Pages).

Ballutaud, J., et al. "Reduction of the Boron Cross-Contamination for Plasma Deposition of P-I-N Devices in a Single-Chamber Large Area Radio-Frequency Reactor" Thin Solid Films, vol. 468, Issues 1-2. Dec. 2004. pp. 222-225.

REDUCED LIGHT DEGRADATION DUE TO LOW POWER DEPOSITION OF BUFFER LAYER

RELATED APPLICATION INFORMATION

This application is related to commonly assigned application Ser. No. 13/406,970, entitled: ENHANCING EFFICIENCY IN SOLAR CELLS BY ADJUSTING DEPOSITION POWER filed concurrently herewith and incorporated herein by reference.

BACKGROUND

Technical Field

The present invention relates to photovoltaic devices and methods for fabrication, and more particularly to devices, structures and fabrication methods that reduce light-induced degradation by setting a work function of a buffer layer.

Description of the Related Art

When a hydrogenated amorphous silicon solar cell (a-Si:H) is soaked in solar radiation, efficiency of the cell is degraded as soaking time increases. Such phenomenon has not been observed for other types of solar cells. This is called the Staebler-Wronski effect. According to conventional theory of the Staebler-Wronski effect (SW effect), hydrogen is reconfigured increasing hydrogen passivation of silicon base materials of the solar cell under photon illumination. The solar cell experiences reduced fill factor (FF) and reduced open circuit voltage ($V_{oc}$) both of which reduce the efficiency of the solar device.

A barrier height or barrier is a difference between work functions between different materials. The barrier is affected by the type of material with which a semiconductor is in contact. A band offset is the measure of misalignment between energy levels at the interface between two solids. The offset between an electrode and a semiconductor is called a "Schottky barrier". These quantities are measures of how much a given material resists the flow of electrical charge through a medium. These quantities are negatively affected in solar cells by light induced cell degradation. Both semiconductor-semiconductor band offset and semiconductor-electrode Schottky barrier increase the SW effect.

SUMMARY

Methods for forming a photovoltaic device include forming a buffer layer between a transparent electrode and a p-type layer. The buffer layer includes a work function that falls substantially in a middle of a barrier formed between the transparent electrode and the p-type layer to provide a greater resistance to light induced degradation. An intrinsic layer and an n-type layer are formed over the p-type layer.

Another method for forming a photovoltaic device includes: forming a transparent electrode on a transparent substrate; depositing a buffer layer on the transparent electrode, the buffer layer being deposited at a deposition power to provide an amorphous germanium layer with a work function that falls substantially in a middle of a barrier formed between adjacent layers to the buffer layer to provide a greater resistance to light induced degradation; depositing a p-type layer on the buffer layer; forming an intrinsic layer on the p-type layer; and forming an n-type layer on the intrinsic layer.

Yet another method for forming a photovoltaic device includes: forming a transparent conductive oxide on a transparent substrate; depositing a buffer layer including germanium on the transparent conductive oxide, the buffer layer being deposited at a deposition power of less than about 0.5 Watts per square centimeter and, more particularly, less than about 0.05 Watts per square centimeter to adjust a work function of the buffer layer; depositing a p-type amorphous silicon carbide layer on the buffer layer such that the work function of the buffer layer falls substantially in a middle of a barrier between the transparent electrode and the p-type layer to provide a greater resistance to light induced degradation; forming an amorphous silicon intrinsic layer on the p-type layer; forming an amorphous silicon n-type layer on the intrinsic layer; and forming a back reflector on the n-type layer.

A photovoltaic device includes a transparent conductive oxide formed on a transparent substrate. A buffer layer includes germanium and is formed on the transparent conductive oxide. A p-type layer is formed on the buffer layer such that the work function of the buffer layer falls substantially in a middle of a barrier formed between the transparent electrode and the p-type layer to provide a greater resistance to light induced degradation. An intrinsic layer is formed on the p-type layer, an n-type layer is formed on the intrinsic layer and a back reflector is formed on the n-type layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
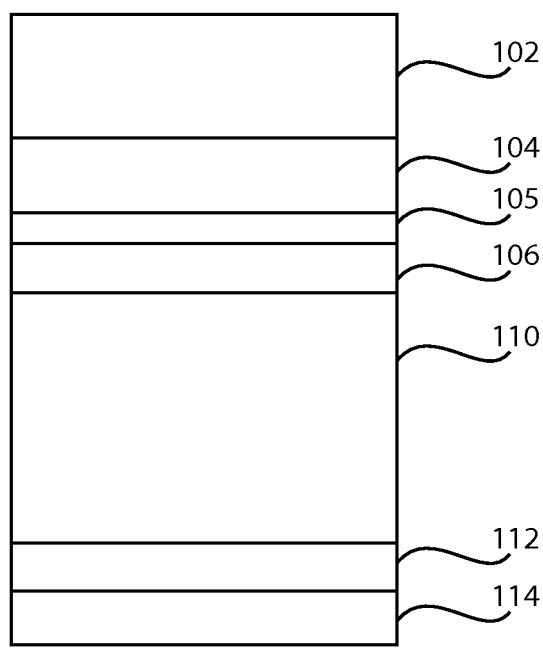
FIG. 1 is a cross-sectional view of a photovoltaic device with a buffer layer formed in accordance with the present principles.

In accordance with the present principles, methods and devices are presented that provide light induced degradation resistance. Light induced degradation occurs in a semiconductor structure when the structure becomes saturated by incoming radiation (light soaked). The structure begins to degrade due in part to the reconfiguration of hydrogen atoms, which results in passivation and bond breaking between constituent materials. This degradation process becomes prominent if there exists a band offset at a p-i interface and/or at a transparent conductive oxide (TCO) to $p^+$ interface.

A band offset describes the relative alignment (e.g., misalignment) of the energy bands between materials at a semiconductor heterojunction. Band offset at the TCO/p+ layer is unavoidable since all developed TCO films are n-type. In particularly useful embodiments, photovoltaic devices are constructed using materials and processes that reduce the risk of light-induced degradation. In one example, a buffer layer is deposited between the TCO and the p+ layer of the device. To provide improved light degradation efficiency, the buffer layer has a work function selected in accordance with a material selection and processing parameters, including deposition power (e.g., power density), to provide a work function that bridges the work functions of adjacent materials. A work function is the minimum energy needed to remove an electron from a solid to a point immediately outside the solid surface (or energy needed to move an electron from the Fermi level into vacuum).

A band gap is an energy range in a solid where no electron states can exist. The band gap generally refers to the energy difference between a top of a valence band and a bottom of a conduction band in insulators and semiconductors. This is equivalent to the energy needed to free an outer shell electron from its orbit about the nucleus to become a mobile charge carrier, able to move freely within the solid material. The buffer layer forms an intermediate band gap layer between the TCO and p+ layers. In one embodiment, a conduction band ($E_c$) is aligned between the buffer layer and the p-type layer.

In accordance with the present principles, a buffer layer whose work function is located in the middle of the barrier formed between two adjacent materials (e.g., between the TCO and the p+ layer) provides minimal light degradation. The middle of the barrier includes an energy preferably within about 10% on either side of the exact middle of the barrier although improvement may be realized for greater differences from the middle. The exact middle energy is preferred improve and optimize degradation efficiency.

Methods and devices are provided that utilize the characteristics of the buffer layer to improve degradation efficiency. In cells including a-Si, Ge forms a good buffer layer; however, by adjusting the work function to fall within the middle of the barrier, improved degradation efficiency is achieved. In one embodiment, the buffer layer includes Ge and is disposed between the TCO layer and the p+ layer of the solar cell. The Ge is deposited in a low power deposition process to adjust the work function resulting in increased resistance to light degradation effects. In particular, when Ge is deposited at low power, e.g., <0.50 W/cm$^2$, amorphous hydrogenated Ge (a-Ge:H) is formed so that the work function is optimal to provide minimal light degradation. When Ge is deposited at high power, e.g., >1.0 W/cm$^2$, hydrogenated micro-crystalline Ge (μc-Ge:H) is provided so that the work function is more inclined toward that of the TCO layer so greater light degradation is experienced. Both phases of Ge (e.g., a-Ge and μc-Ge), in the buffer layer work well for carrier flow by tunneling through the barrier between the TCO layer and the p+ layer. This is due to high conductivity of Ge films. μc-Ge:H is better for this purpose since it has higher conductivity than a-Ge:H for the initial cell performance before light degradation. However, these two phases of Ge show clear differences when soaked under the sun light as will be described.

It should be understood that the power density values recited herein are provided as examples. The power densities given are not absolute values and may change for different tools and conditions. The power densities given here represent those tested to provide a location of work function for the buffer layer in the middle of the barrier between adjacent materials. For example, using Ge as a material for the buffer layer, the power densities are selected to provide a-Ge:H instead of μc-Ge:H in a specific tool and deposition conditions.

It is to be further understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit or board may be embodied in a graphical computer programming language, and stored in a computer storage medium (such as a disk, tape, physical hard drive, or virtual hard drive such as in a storage access network). If the designer does not fabricate chips or photovoltaic devices, the designer may transmit the resulting design by physical means (e.g., by providing a copy of the storage medium storing the design) or electronically (e.g., through the Internet), directly or indirectly.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor.

It should be further understood that material compounds will be described in terms of listed elements, e.g., SiC, SiGe, etc. These compounds include different proportions of the elements within the compound, e.g., $Si_xC_y$, where $x/y \neq 1$, etc. In addition, other elements may be included in the compound and still function in accordance with the present principles.

Referring now to the drawings in which like numerals represent the same or similar elements and initially to FIG. 1, an illustrative photovoltaic structure 100 is depicted in accordance with one embodiment. The photovoltaic structure 100 may be employed in solar cells, light sensors or other photovoltaic applications. Structure 100 includes a substrate 102 that permits a high transmittance of light. The substrate 102 may include a transparent material, such as glass, a polymer, etc. or combinations thereof.

A first electrode 104 includes a transparent conductive material. Electrode 104 may include a transparent conductive oxide (TCO), such as, e.g., a fluorine-doped tin oxide ($SnO_2$:F, or "FTO"), doped zinc oxide (e.g., ZnO:Al), indium tin oxide (ITO) or other suitable materials. For the present example, a doped zinc oxide is illustratively employed for electrode 104. The electrode or TCO 104 permits light to pass through to an active light-absorbing material beneath and allows conduction to transport photogenerated charge carriers away from that light-absorbing material. The TCO 104 may be deposited by a chemical vapor deposition (CVD) process, low pressure CVD (LP-CVD) process or a plasma-enhanced CVD (PE-CVD) process.

A buffer layer 105 may include germanium or silicon germanium and may include at least one p-type dopant such as B, Ga, and In. In one embodiment, the buffer layer 105 includes a silicon-germanium alloy layer including germanium, silicon, optionally a p-type dopant, and hydrogen. In this embodiment, the atomic concentration of germanium is greater than 50%. Depending on the work-function of TCO 104, Si content in Ge can be varied. The buffer layer 105 has a greater atomic concentration of germanium than a p-doped layer 106 formed on the buffer layer 105.

The buffer layer 105 can be amorphous, microcrystalline, or single crystalline. The buffer layer 105 may include a hydrogenated material. For example, if the buffer layer 105 includes a hydrogenated amorphous silicon germanium alloy, a hydrogenated microcrystalline silicon-germanium alloy, a hydrogenated amorphous germanium, or a hydrogenated microcrystalline germanium, the hydrogenation of the material of the buffer layer 105 decreases localized electronic states and increases the conductivity of the buffer layer 105.

The buffer layer 105 can be formed, for example, by a chemical vapor deposition (CVD) process or plasma enhanced chemical vapor deposition (PECVD). The thickness of the buffer layer 105 can be from about 1 nm to about 20 nm, although lesser and greater thicknesses can also be employed. In accordance with the present principles, light degradation of the buffer layer 105 and the device 100 overall can be improved by employing processing parameters or adjustments to a work function of the buffer layer 105.

In one embodiment, the buffer layer 105 is disposed between the electrode 104 and a p-type layer 106. The buffer layer 105 has a material and a process selected to optimize light degradation. In accordance with the findings of the present inventors, a work function for the buffer layer 105 should have an energy at a level that falls in a middle of a barrier between the electrode 104 and the p-type layer 106. For example, if a work function of the electrode 104 is A, and the work function of the p-type layer is B, the work function of the buffer layer should be about (B−A)/2+A (e.g., the middle, See e.g., FIG. 2). The work function of the buffer layer 105 should be within about ±10% of the middle, although greater or lesser energies may be employed.

In one example, a work function of TCO 104 is about 4.5 eV and the work function of the p-type layer 106 (e.g., p+ a-Si:C) is approximately 5.7 eV. A work function of the buffer layer 105 (a-Ge:H) should be approximately 5.1 eV (e.g., (5.7−4.5)/2+4.5=5.1). This can be achieved by, e.g., adjusting a deposition power to below, e.g., 500 mW/cm$^2$. Compare this to a work function of the buffer layer 105 formed by a high deposition power (e.g., over 1000 mW/cm$^2$), which forms, e.g., μc-Ge:H, which has a work function of approximately 4.6 eV.

An optimum work function for an effective band gap bridge buffer layer 105 should be in the middle of the barrier between the TCO 104 and the p-type layer 106 (e.g., p+ a-SiC). The work function for these materials should ~5.1 eV. Any highly conductive buffer layer 105 whose work function is located between the work function of the TCO 104 and the work function of the p-type layer works very well to provide a high FF of an a-Si:H solar cell device.

In one embodiment, the buffer layer 105 may be formed by a GeH$_4$ plasma enhanced deposition. The low power deposition includes a power density of less than about 0.50 W/cm$^2$ and preferably less than about 0.10 W/cm$^2$, and more preferably less than about 0.05 W/cm$^2$. The deposition power is reduced from normally higher deposition powers, which can result in higher device efficiencies, at least in the short term. The low power PECVD results in greater resistance to light degradation. In addition, the lower power deposition process is more manufacturing-friendly as less energy is used and thermal budget is maintained. The low power process sacrifices initial device efficiency for longer term device efficiency. That is to say, the stable efficiency, which means the final efficiency after light degradation, can be higher in low power processed solar cells than high power processed solar cells although initial efficiency immediately after solar cell deposition is usually higher in solar cells with high power depositions due to higher crystallinity (e.g., higher conductivity when using high power process).

The p-doped layer 106 includes an amorphous, microcrystalline, or single-crystalline p-doped silicon-containing material. The p-doped layer 106 can be a p-doped silicon layer including silicon and at least one p-type dopant and optionally hydrogen; a p-doped silicon-germanium alloy layer including silicon, germanium, at least one p-type dopant and optionally hydrogen; a p-doped silicon-carbon alloy layer including silicon, carbon, at least one p-type dopant and optionally hydrogen; or a p-doped silicon-germanium-carbon alloy layer including silicon, germanium, carbon, at least one p-type dopant and optionally hydrogen.

In some cases, the p-doped layer 106 may include a hydrogenated amorphous, microcrystalline, or single-crystalline p-doped silicon-containing material. The presence of hydrogen in the p-doped layer 106 can increase the concentration of free charge carriers, i.e., holes, by delocalizing the electrical charges that are pinned to defect sites. A hydrogenated p-doped silicon-containing material can be deposited in a process chamber containing a silicon-containing reactant gas as a carrier gas. To facilitate incorporation of hydrogen in the hydrogenated p-doped silicon-containing material, a carrier gas including hydrogen can be employed. Hydrogen atoms in the hydrogen gas within the carrier gas are incorporated into the deposited material to form an amorphous or microcrystalline hydrogenated p-doped silicon-containing material of the p-doped layer 106.

In one embodiment, p-doped or p-type layer 106 includes boron as a dopant, although other p-type dopants may be employed. Layer 106 may be deposited using diborane gas, trimethylborane or other gases. The p-type layer 106 may have a thickness of between about 5-20 nm. In particularly useful embodiments, layer 106 includes amorphous SiC although microcrystalline SiC:H, amorphous Si:H or microcrystalline Si:H may also be employed.

Processing continues with formation of an intrinsic layer 110 formed on layer 106 of compatible material. Intrinsic layer 110 may be undoped and may include an amorphous silicon material, e.g., hydrogenated amorphous Si (a-Si:H). The intrinsic layer 110 may include a thickness of between about 100-300 nm, although other thicknesses are contemplated. The intrinsic layer 110 may include, e.g., a-Si:H or a hydrogenated amorphous silicon carbide (a-SiC:H) and may be deposited by a chemical vapor deposition (CVD) process, or a plasma-enhanced (PE-CVD). The a-Si:H may be deposited from silane gas and hydrogen gas.

A doped layer 112 (e.g., an n-type layer) is formed on the intrinsic layer 110. Layer 112 may include an n-type Si containing layer, e.g., a hydrogenated microcrystalline Si (μc-Si:H), a crystalline Si or an a-Si layer. Layer 112 may be deposited by a chemical vapor deposition (CVD) process, or a plasma-enhanced (PE-CVD). The n-type layer 112 may have a thickness of between about 5-20 nm. A back reflector and/or bottom electrode 114 may be formed by a reflective metal, such as Ag, Al, Au, etc. A suitable metal deposition process may be employed, e.g., physical or chemical vapor deposition, sputtering, electro or electroless plating, etc. It should be understood that other material selections, layers, structures, etc. may be employed in device 100 including additional back reflectors or instead of back reflectors, tandem cells, etc.

Figure 2:
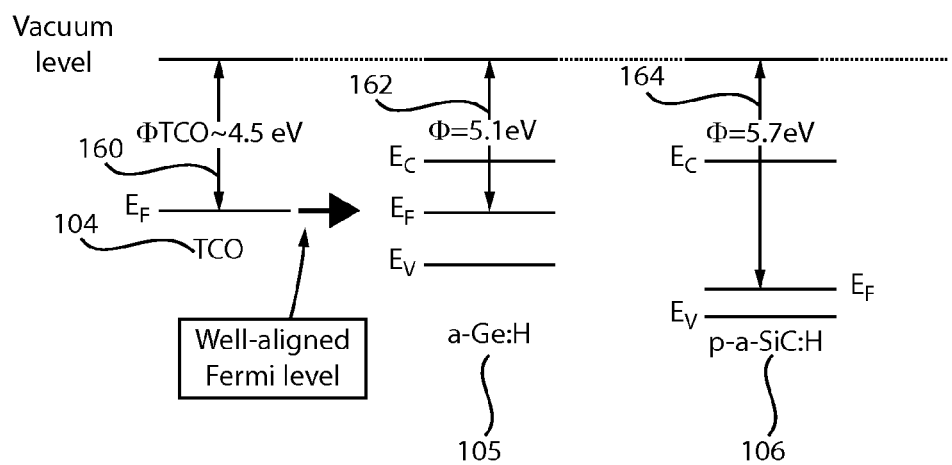
FIG. 2 is an energy diagram showing alignment of energies in accordance with one example of the present principles.

Referring to FIG. 2, an energy diagram shows the alignment of Fermi levels and work function values employed to improve light degradation in accordance with the present principles. The diagram employs the values used in the example set forth above. In the example, a work function 160 of TCO 104 is 4.5 eV and a work function 162 of the p-type layer 106 (e.g., p+ a-Si:C) is approximately 5.7 eV. A work function 164 of the buffer layer 105 (a-Ge:H) is approximately 5.1 eV. Fermi levels ($E_F$) between the TCO 104 and the buffer layer 105 are well aligned as are conduction band energies ($E_c$) of the p-type layer 106 and the buffer layer 105.

Figure 3:
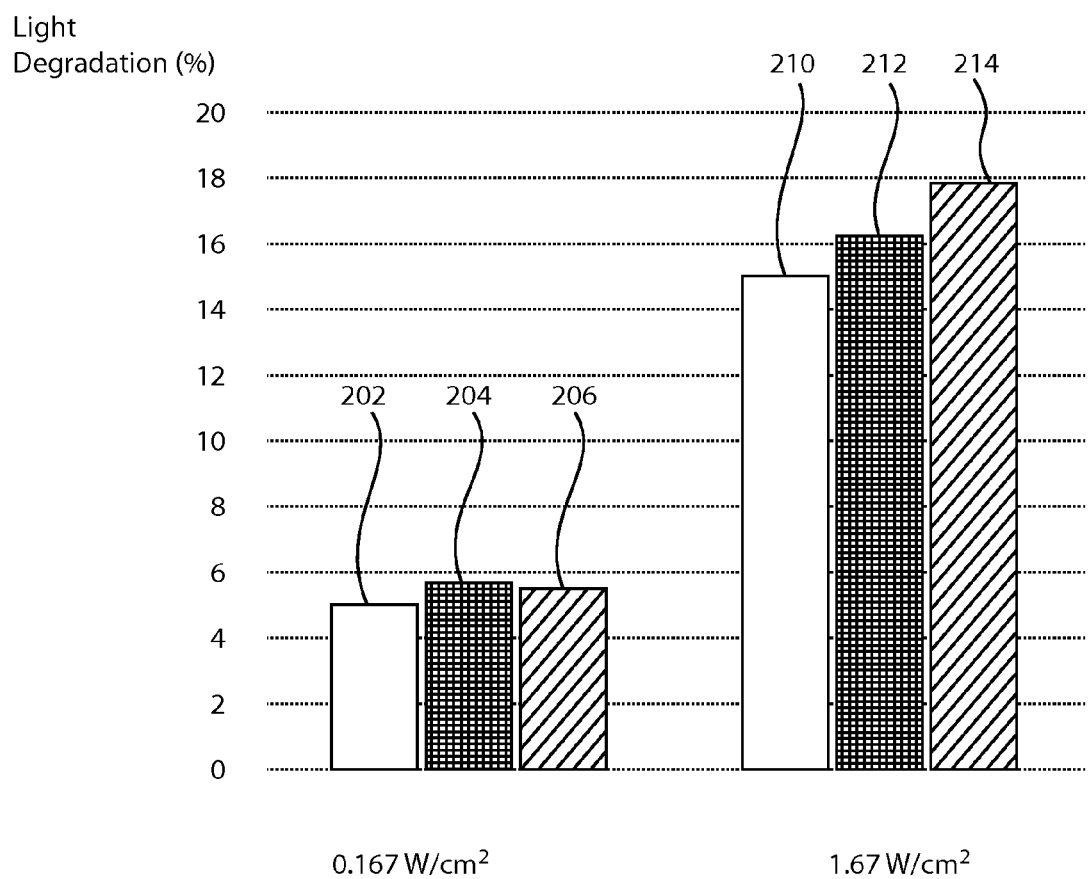
FIG. 3 depicts a bar chart of light induced degradation efficiency versus samples for photovoltaic devices with low deposition power in accordance with the present principles, samples having higher deposition power are shown for comparison.

Referring to FIG. 3, experimental results for devices fabricated using a low power deposition and a high power deposition are comparably depicted. In accordance with one illustrative example, 15%-17% light degradation is reduced to about 5% by employing the low power Ge deposition in accordance with the present principles. These results are conservative as improvements in light induced efficiency degradation can be even greater. FIG. 3 shows a bar chart showing light degradation (%) for three samples fabricated at different power deposition levels for depositing a Ge buffer layer (105). Samples 210, 212 and 214 include a Ge buffer layer deposited at a power of about 1.67 Watts/cm². While 1.67 Watts/cm² provides a reasonable overall device efficiency, the typical tendency would be to deposit the Ge buffer layer with an even higher power to increase device efficiency and fill factor. Samples 210, 212 and 214 have a light degradation efficiency of between about 15% and 18%.

In contradiction of the trend to increase deposition power, the present inventors have reduced the deposition power to about 0.167 Watts/cm² and have discovered the light degradation was reduced to about 5% for samples 202, 204 and 206. This means that the samples 202, 204 and 206 experienced less degradation due to light exposure or light soaking. Light degradation, which has plagued amorphous silicon photovoltaic devices and, in particular, hydrogenated amorphous silicon photovoltaic devices, is significantly reduced using a buffer layer with an adjusted work function in accordance with the present principles. Samples 202, 204, 206, 210, 212 and 214 were the same in all other manufacturing process steps.

Table 1 shows some data collected from cells that were subjected to 16 hours of light soaking for samples made in a high power conventional deposition process and a low power deposition process in accordance with the present principles. Before the degradation process (16 hours of light soaking), the high power samples showed a better overall initial efficiency and a comparable fill factor (FF).

TABLE 1

Device efficiency and FF for devices formed by a high Ge deposition process and a low Ge deposition process.

| Ge Deposition Power | Initial Efficiency | Efficiency after degradation (16 hours) | Initial FF | FF after degradation (16 hours) |
|---|---|---|---|---|
| High | 7.0775 | 6.02764 | 73.6285 | 69.443 |
| Low | 6.71315 | 6.37847 | 70.1875 | 68.2265 |

Fill factor (FF) is a ratio of the maximum power point ($P_m$) divided by open circuit voltage ($V_{oc}$) and short circuit current ($J_{sc}$):

$$FF = \frac{P_m}{V_{oc}J_{sc}}.$$

Higher open circuit voltage provides greater efficiency if other parameters remain the same.

For the conventional high power deposition process, the device efficiency before degradation was 7.0775% and the FF was 73.6285. After degradation, the device efficiency was 6.02764% and the FF was 69.443. For the low power deposition process in accordance with the present principles, the device efficiency before degradation was 6.71315% and the FF was 70.1875. Although these initial values have been reduced due to the low power process, after degradation (16 hours of light soaking), the device efficiency was 6.37847% and the FF was 68.2265 (as compared to 6.02764% and the FF=69.443 for the high power deposition process). In this way, the stable efficiency of the devices made in accordance the present principles is maintained at a higher value over the useful life of the device, while FF remains comparable.

Figure 4:
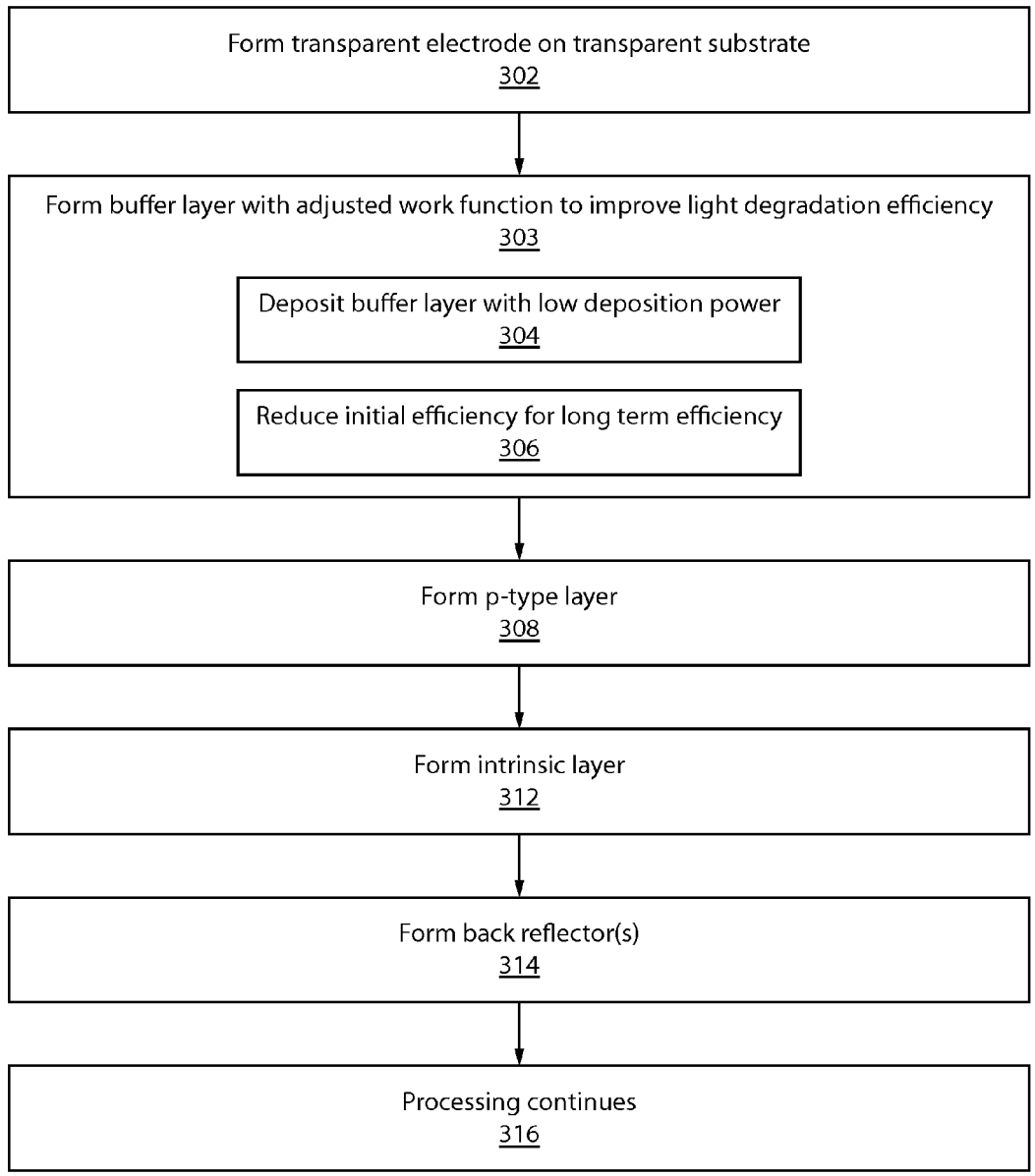
FIG. 4 is a block/flow diagram showing methods for fabricating a photovoltaic device having a buffer layer with an adjusted work function (e.g., by a low deposition power process) in accordance with illustrative embodiments.

Referring to FIG. 4, methods for forming a photovoltaic device are illustratively shown. It should also be noted that, in some alternative implementations, the functions noted in the blocks may occur out of the order noted in FIG. 4. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 302, a transparent electrode is formed on a transparent substrate. The transparent electrode may include a transparent conductive oxide or the like. In block 303, a buffer is deposited on the transparent electrode. The buffer layer is formed to include a work function that is substantially in the middle of a barrier between adjacent layers to provide a greater resistance to light induced degradation. In block 304, the buffer layer is formed (e.g., from a Ge containing material) by a low deposition power of less than about 0.50 Watt per square centimeter. The low deposition power may be less than about 0.10 Watts per square centimeter and even less than about 0.05 Watts per square centimeter.

The buffer layer may include at least one of a hydrogenated amorphous silicon germanium alloy, a hydrogenated microcrystalline silicon-germanium alloy, a hydrogenated amorphous germanium or a hydrogenated microcrystalline germanium. The microcrystalline forms of Ge may be employed if their work functions are properly adjusted toward the middle of the barrier. The buffer layer is preferably deposited by a plasma enhanced chemical vapor deposition process, although other processes may be employed.

In block 306, depositing the buffer layer includes reducing initial efficiency (and increasing degradation resistance) to provide improved long-term efficiency of the photovoltaic device. This may be due to the adjustment in the deposition power of the buffer layer to locate the work function in the middle of a barrier between the adjacent materials.

In block 308, a p-type layer is deposited or formed on the buffer layer. The buffer layer bridges or aligns a Fermi level ($E_F$) with the transparent electrode. Conduction band energies between the buffer layer and the p-type layer are also aligned. This better transitions the differential between energy barriers of the transparent electrode and the p-type layer. In block 310, an intrinsic layer is formed on the p-type layer. In block 312, an n-type layer is formed on the intrinsic layer. In block 314, a back reflector or back reflectors may be formed. In one embodiment, the p-type layer includes a form of silicon (e.g., a-Si, a-Si:H, a-SiC, a-SiC:H, crystalline forms of Si or SiC, etc.). The intrinsic layer may include a-Si, a-Si:H, or crystalline forms of Si, etc.). The n-type layer may include an n-doped form of a-Si, a-Si:H, or crystalline forms of Si, etc.). In block 316, processing continues to complete the photovoltaic device.

Having described preferred embodiments for reduced light degradation due to low power deposition of buffer layer in photovoltaic devices (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a photovoltaic device, comprising:
    forming a buffer layer between a transparent electrode and a p-type layer, the buffer layer including an amorphous form of germanium having a work function that falls substantially in a middle of a barrier formed between the transparent electrode and the p-type layer to provide a greater resistance to light induced degradation, wherein deposition power for forming the buffer layer is adjusted to adjust said work function.

2. The method as recited in claim 1, further comprising forming an intrinsic layer and an n-type layer over the p-type layer.

3. The method as recited in claim 1, wherein forming the buffer layer includes depositing a germanium containing material at said deposition power of less than about 0.50 Watts per square centimeter.

4. The method as recited in claim 3, wherein the deposition power includes a power of less than about 0.05 Watts per square centimeter.

5. The method as recited in claim 1, wherein forming the buffer layer includes reducing initial photovoltaic device efficiency to provide improved long-term efficiency of the photovoltaic device.

6. The method as recited in claim 1, wherein the buffer layer includes a Fermi level aligned with the transparent electrode.

7. The method as recited in claim 1, wherein forming a buffer layer includes forming the buffer layer with a plasma enhanced chemical vapor deposition process.

8. The method as recited in claim 1, wherein the p-type layer includes a form of silicon.

9. The method as recited in claim 8, wherein the p-type layer includes at least one of amorphous silicon, amorphous silicon carbide, hydrogenated amorphous silicon, or hydrogenated amorphous silicon carbide.

10. A method for forming a photovoltaic device, comprising:
    forming a transparent electrode on a transparent substrate;
    depositing a buffer layer on the transparent electrode, the buffer layer being deposited at a deposition power to provide an amorphous germanium layer with a work function that falls substantially in a middle of a barrier formed between adjacent layers to the buffer layer to provide a greater resistance to light induced degradation, wherein the deposition power for forming the buffer layer is adjusted to adjust said work function;
    depositing a p-type layer on the buffer layer;
    forming an intrinsic layer on the p-type layer; and
    forming an n-type layer on the intrinsic layer.

11. The method as recited in claim 10, wherein depositing the buffer layer includes depositing at least one of a hydrogenated amorphous silicon germanium alloy, or a hydrogenated amorphous germanium.

12. The method as recited in claim 10, wherein the deposition power includes a power of less than about 0.50 Watts per square centimeter.

13. The method as recited in claim 10, wherein the deposition power includes a power of less than about 0.050 Watts per square centimeter.

14. The method as recited in claim 10, wherein depositing the buffer layer includes reducing initial efficiency to provide improved long-term efficiency of the photovoltaic device.

15. The method as recited in claim 10, wherein the buffer layer includes a Fermi level aligned with the transparent electrode.

16. The method as recited in claim 10, wherein depositing a buffer layer includes depositing the buffer layer with a plasma enhanced chemical vapor deposition process.

17. The method as recited in claim 10, wherein the p-type layer includes at least one of amorphous silicon, amorphous silicon carbide, hydrogenated amorphous silicon, or hydrogenated amorphous silicon carbide.

18. A method for forming a photovoltaic device, comprising:
    forming a transparent conductive oxide on a transparent substrate;
    depositing a buffer layer including germanium on the transparent conductive oxide, the buffer layer being deposited at a deposition power of less than about 0.05 Watts per square centimeter to adjust a work function of the buffer layer, wherein the deposition power is a sole deposition parameter being adjusted to adjust said work function; and
    depositing a p-type amorphous silicon carbide layer on the buffer layer such that the work function of the buffer layer falls substantially in a middle of a barrier between the transparent electrode and the p-type layer to provide a greater resistance to light induced degradation.

19. The method of claim 18 further comprising:
forming an amorphous silicon intrinsic layer on the p-type layer;
forming an amorphous silicon n-type layer on the intrinsic layer; and
forming a back reflector on the n-type layer.

20. The method as recited in claim 10, wherein depositing the buffer layer includes reducing initial efficiency to provide improved long term efficiency of the photovoltaic device.

* * * * *